(12) United States Patent
Utsumi et al.

(10) Patent No.: US 12,538,538 B2
(45) Date of Patent: Jan. 27, 2026

(54) SILICON CARBIDE SEMICONDUCTOR DEVICE AND SILICON CARBIDE SEMICONDUCTOR SUBSTRATE

(71) Applicant: FUJI ELECTRIC CO., LTD., Kawasaki (JP)

(72) Inventors: Makoto Utsumi, Nagano (JP); Masaki Miyazato, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 573 days.

(21) Appl. No.: 18/160,533

(22) Filed: Jan. 27, 2023

(65) Prior Publication Data

US 2023/0282709 A1 Sep. 7, 2023

(30) Foreign Application Priority Data

Mar. 7, 2022 (JP) ................. 2022-034816

(51) Int. Cl.
*H10D 62/832* (2025.01)
*H10D 12/01* (2025.01)
*H10D 30/66* (2025.01)

(52) U.S. Cl.
CPC ....... *H10D 62/8325* (2025.01); *H10D 12/031* (2025.01); *H10D 30/66* (2025.01)

(58) Field of Classification Search
None
See application file for complete search history.

(56) References Cited

U.S. PATENT DOCUMENTS

| 2021/0280707 A1 | 9/2021 | Kinoshita |
| 2023/0282709 A1* | 9/2023 | Utsumi ............... H10D 30/668 257/77 |

FOREIGN PATENT DOCUMENTS

| JP | 2007-320790 A | 12/2007 |
| JP | 2021-141146 A | 9/2021 |

* cited by examiner

*Primary Examiner* — Jack S Chen
(74) *Attorney, Agent, or Firm* — Rabin & Berdo, P.C.

(57) ABSTRACT

An $n^+$-type SiC substrate constituting an $n^+$-type drain region contains a concentration of nitrogen, which is a donor, within a predetermined range (predetermined impurity concentration of the $n^+$-type drain region) and, as impurities other than the nitrogen, contains boron, aluminum, and titanium such that a sum of respective concentrations of the boron, aluminum, and titanium is an amount that does not affect the n-type impurity concentration of the $n^+$-type SiC substrate (impurity concentration of the $n^+$-type drain region). The boron, aluminum, and titanium in the $n^+$-type SiC substrate function as a lifetime killer of majority carriers. The boron concentration of the $n^+$-type SiC substrate is in a range of $5\times10^{16}/cm^3$ to $1\times10^{17}/cm^3$. The aluminum concentration and the concentration of the titanium concentration of the $n^+$-type SiC substrate are each within a range of $1\times10^{16}/cm^3$ to $5\times10^{16}/cm^3$.

9 Claims, 7 Drawing Sheets

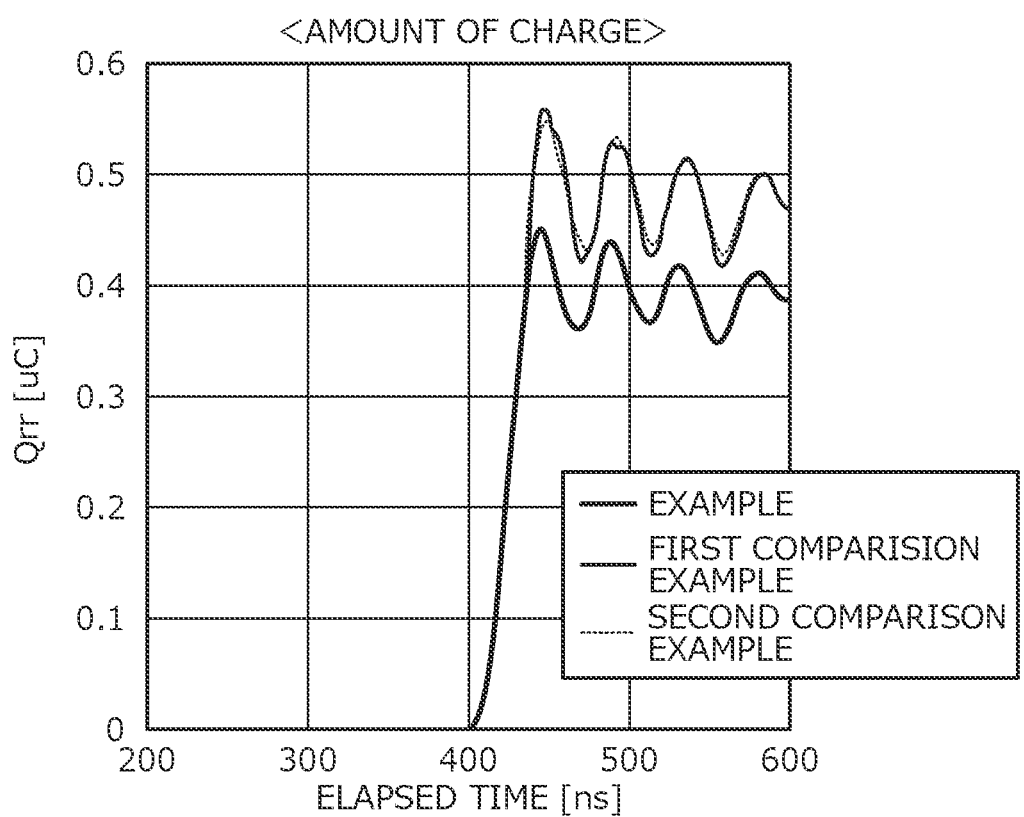

SILICON CARBIDE SEMICONDUCTOR DEVICE AND SILICON CARBIDE SEMICONDUCTOR SUBSTRATE

CROSS REFERENCE TO RELATED APPLICATIONS

This application is based upon and claims the benefit of priority of the prior Japanese Patent Application No. 2022-034816, filed on Mar. 7, 2022, the entire contents of which are incorporated herein by reference.

BACKGROUND OF THE INVENTION

1. Field of the Invention

Embodiments of the invention relate to a silicon carbide semiconductor device and a silicon carbide semiconductor substrate.

2. Description of the Related Art

An n-type silicon carbide semiconductor substrate (hereinafter, SiC substrate) that contains silicon carbide (SiC), which, in general, is widely used as semiconductor material, contains nitrogen (N) (n-type dopant, donor) of a predetermined impurity concentration range, boron (B) of a range of about $1 \times 10^{15}/cm^3$ to $5 \times 10^{15}/cm^3$ as an impurity other than nitrogen, and an impurity (other than nitrogen) below a detectable limit (in an undetectable impurity concentration range). It has been disclosed that in a silicon carbide semiconductor device that uses such an n-type type SiC substrate, even when the nitrogen concentration is the same, when the boron concentration is lowered, the probability of carrier recombination in the SiC substrate decreases and the lifetime of majority carriers (electrons) in the SiC substrate increases (for example, refer to Japanese Laid-Open Patent Publication No. 2021-141146).

In a SiC metal oxide semiconductor field effect transistor SiC-MOSFET fabricated (manufactured) using this SiC substrate (starting substrate) and having insulated gates with a 3-layer structure including a metal, an oxide film, and a semiconductor, when a parasitic diode (body diode) formed by a pn junction between a p-type base region and an n$^-$-type drift region conducts, holes are injected into the n$^-$-type drift region, whereby the carrier concentration in the n$^-$-type drift region increases and the lifetime of the majority carriers in the n$^-$-type drift region increase. Thus, one advantage is that an effect of conductivity modulation may be used to cause the body diode to operate at a lower resistance.

As for a method of manufacturing a conventional SiC single crystal ingot, a method has been proposed in which as a source gas, a gas that contains an impurity constituting an n-type dopant and a gas that contains an impurity constituting a p-type dopant (acceptor) are introduced into an SiC single crystal growth atmosphere, whereby the SiC single crystal is grown having a uniform impurity concentration spanning an entire crystal region of the SiC single crystal ingot (for example, refer to Japanese Laid-Open Patent Publication No. 2007-320790). Japanese Laid-Open Patent Publication No. 2007-320790 discloses that, as a source gas introduced into the SiC single crystal growth atmosphere, a gas containing nitrogen as an n-type dopant and a gas containing boron and/or aluminum as a p-type dopant may be used.

SUMMARY OF THE INVENTION

According to an embodiment of the invention, a silicon carbide semiconductor device includes: a silicon carbide semiconductor substrate containing silicon carbide, the silicon carbide semiconductor substrate having a first main surface and a second main surface that are opposite to each other; a first semiconductor region of a first conductivity type, provided in the silicon carbide semiconductor substrate; a second semiconductor region of a second conductivity type, provided between the first main surface of the silicon carbide semiconductor substrate and the first semiconductor region; a third semiconductor region of the first conductivity type, provided between the second main surface of the silicon carbide semiconductor substrate and the first semiconductor region, the third semiconductor region having an impurity concentration that is higher than an impurity concentration of the first semiconductor region; a device element structure provided in the silicon carbide semiconductor substrate, at the first main surface, the device element structure having, as a main junction, a pn junction between the second semiconductor region and the first semiconductor region; a first electrode provided on the first main surface, the first electrode being electrically connected to the pn junction; and a second electrode provided on the second main surface. The third semiconductor region: contains a predetermined concentration of nitrogen, the nitrogen being a donor, contains boron in a range of $5 \times 10^{16}/cm^3$ to $1 \times 10^{17}/cm^3$, and contains aluminum and titanium, each in a range of $1 \times 10^{16}/cm^3$ to $5 \times 10^{16}/cm^3$.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 10 is a characteristics diagram depicting results of the amount of charge in a drift region during reverse recovery in the example.

DETAILED DESCRIPTION OF THE INVENTION

Figure 1:
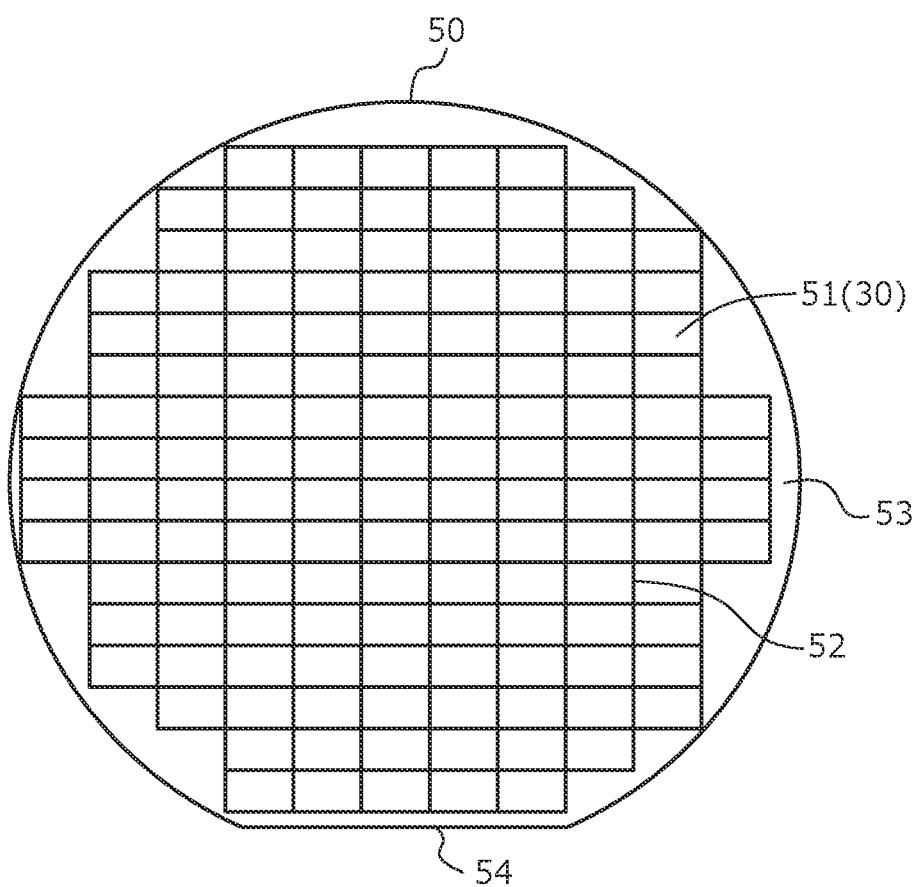
FIG. 1 is a plan view depicting a layout when a semiconductor wafer on which a silicon carbide semiconductor device according to an embodiment is manufactured (fabricated) is viewed from a front side of the semiconductor wafer.

First, problems associated with the conventional techniques are discussed. In a SiC-MOSFET fabricated using an n-type SiC substrate (starting substrate for an epitaxial substrate) that contains, as an impurity, boron within the impurity concentration range described above, when the probability of carrier recombination in an n$^+$-type SiC substrate constituting an n$^+$-type drain region decreases, the probability of carrier recombination close to a border between the n$^+$-type SiC substrate and an n$^-$-type silicon carbide epitaxial layer that is epitaxially grown on the n$^+$-type SiC substrate and constitutes an n$^-$-type drift region decreases, whereby the lifetime of the majority carriers in the n$^-$-type drift region is presumed to increase.

Nonetheless, when the lifetime of the majority carriers in the n$^-$-type drift region increases, during conduction (forward bias) of the body diode, due to carriers (holes and electrons) accumulated in the n$^-$-type drift region, during reverse recovery operation (during reverse bias) of the body diode, reverse recovery current flows in a direction from the n$^+$-type drain region to the n$^+$-type source region. Thus, a problem arises in that during an operation of switching from OFF to ON by the SiC-MOSFET, the reverse recovery current increases (refer to first and second comparison examples in FIG. 8), whereby switching loss increases.

Embodiments of a silicon carbide semiconductor device and a silicon carbide semiconductor substrate according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described.

Figure 2:
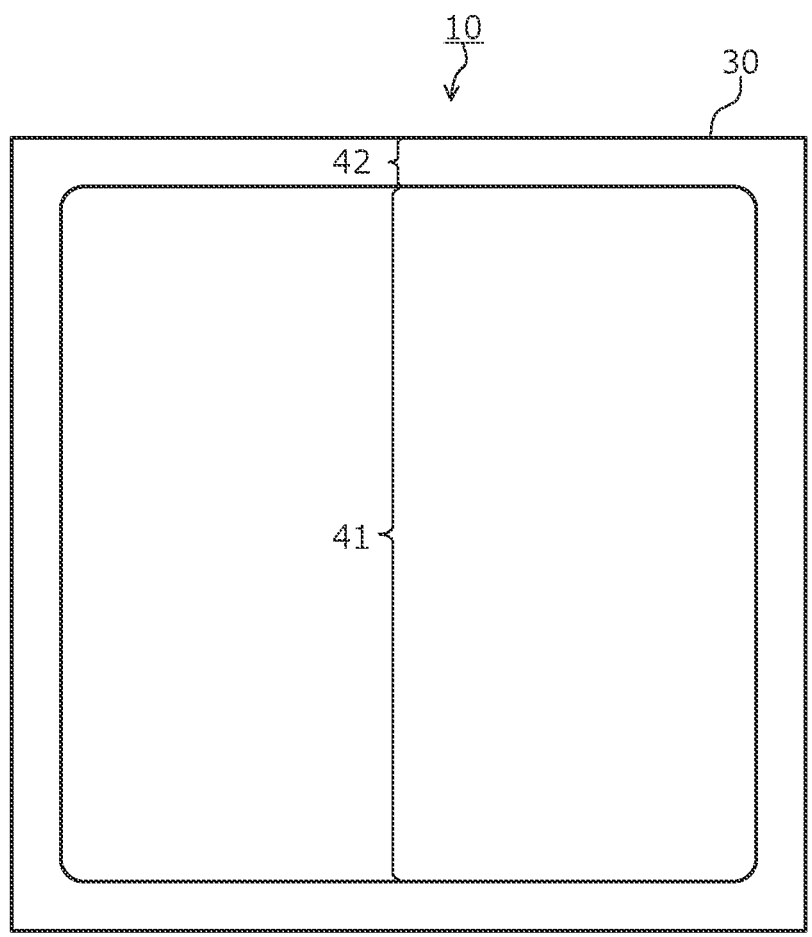
FIG. 2 is a plan view depicting a layout when a semiconductor chip cut from the semiconductor wafer in FIG. 1 is viewed from a front side of the semiconductor chip.
Figure 3:
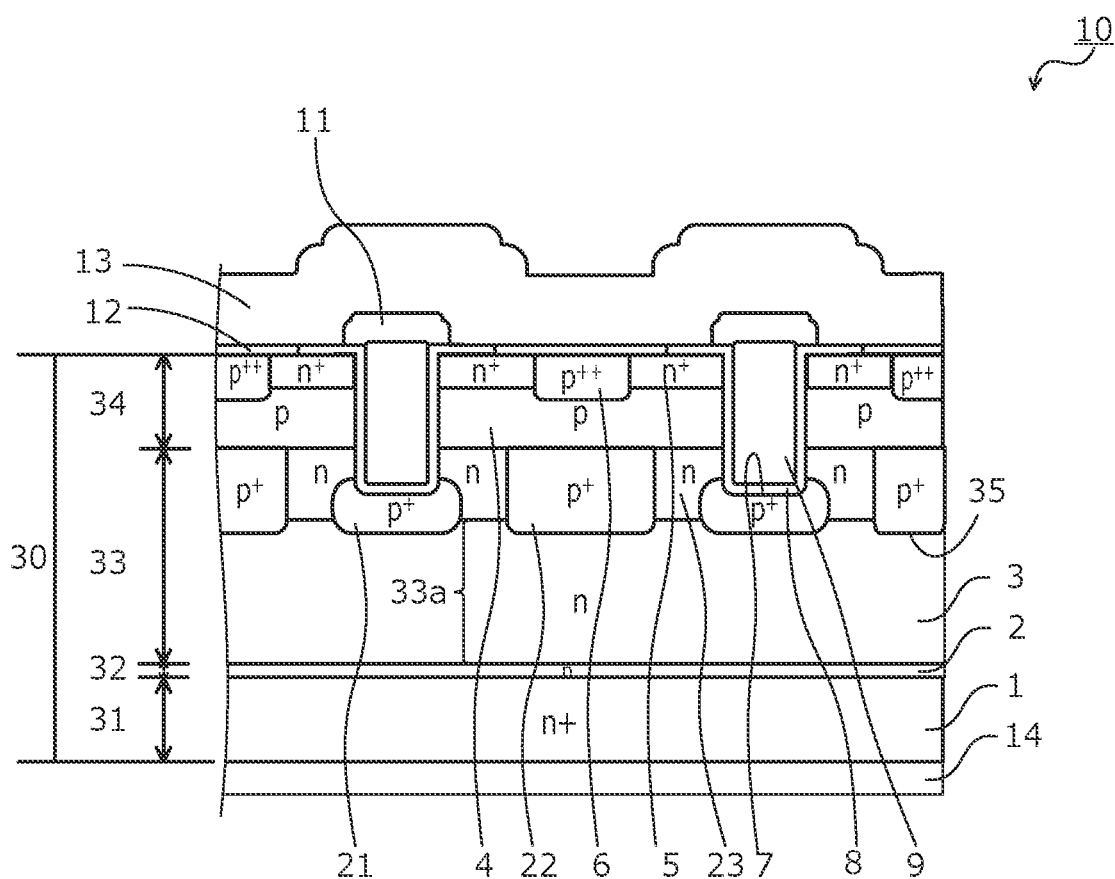
FIG. 3 is a cross-sectional view depicting a structure of an active region in FIG. 2.

FIG. 1 is a plan view depicting a layout when a semiconductor wafer on which a silicon carbide semiconductor device according to an embodiment is manufactured (fabricated) is viewed from a front side of the semiconductor wafer. FIG. 2 is a plan view depicting a layout when a semiconductor chip cut from the semiconductor wafer in FIG. 1 is viewed from a front side of the semiconductor chip. FIG. 2 depicts a state of one chip region 51 after being cut from a semiconductor wafer 50 in FIG. 1. FIG. 3 is a cross-sectional view depicting a structure of an active region in FIG. 2. FIGS. 4, 5, 6, and 7 are characteristics diagrams depicting, respectively, a nitrogen (N) concentration distribution, a boron (B) concentration distribution, an aluminum (Al) concentration distribution, and a titanium (Ti) concentration distribution of the SiC substrate in FIG. 3. In FIGS. 4 to 7, a horizontal axis indicates depth [μm] from the surface of a SiC epitaxial layer 33 while a vertical axis indicates impurity concentration [/cm$^3$].

A silicon carbide semiconductor device 10 according to the embodiment depicted in FIGS. 2 and 3 is fabricated (manufactured), by a general method of manufacturing, in each of the chip regions 51 (refer to FIG. 1) of the semiconductor wafer 50 that contains silicon carbide (SiC) as a semiconductor material, and each of the chip regions 51 forms an individual semiconductor chip (semiconductor substrate) 30. The semiconductor wafer 50 is an epitaxial wafer in which SiC epitaxial layers (portion constituting SiC epitaxial layers 32, 33, 34 in FIG. 3) are epitaxially grown on an n$^+$-type SiC wafer (portion constituting an n$^+$-type SiC substrate 31 in FIG. 3) that contains silicon carbide as a semiconductor material.

The semiconductor wafer 50 may have for example, an orientation flat (linear-shaped notch provided in a portion of an edge end) 54 or a notch (V-shaped notch (not depicted) provided in a portion of an edge end) that indicates surface orientation. The chip regions 51 of the semiconductor wafer 50 are cut (diced) along dicing lines 52 into the individual semiconductor chips 30. The n$^+$-type SiC wafer is a SiC single crystal wafer (starting wafer for epitaxial wafer) cut (sliced) from a SiC single crystal ingot and, for example, is subject to finishing processing such as chamfering (beveling), mirror polishing (polishing), etc.

The chip region 51 has a substantially rectangular shape in a plan view thereof and is disposed in plural in a matrix-like shape in substantially a center portion of the semiconductor wafer 50. The chip regions 51 are disposed so that an adjacent two of the chip regions 51, for example, share one edge. The dicing lines 52 are formed at each border between an adjacent two of the chip regions 51. The dicing lines 52 surround peripheries of the chip regions 51 in a lattice-like shape. The dicing lines 52 are grooves formed at a main surface (surface having the SiC epitaxial layers) of the semiconductor wafer 50. In the dicing lines 52, a mark (position indicator mark: not depicted) for indicating a position (coordinates) in directions parallel to the surface of the semiconductor wafer 50 is formed.

The position indicator mark is a mark for indicating positions of the chip regions 51 or the like. The position indicator mark, for example, is a protruding portion or a recessed portion having a predetermined shape (for example, a cross-shape) in a plan view thereof and is formed in the dicing lines 52 by etching. The position indicator mark may be provided in a dead region 53 of the semiconductor wafer 50. The dead region 53 is a portion that is not used for the semiconductor chips 30, between the end of the semiconductor wafer 50 and the outermost ones of the chip regions 51, closest to the end of the semiconductor wafer 50. An alignment mark for positioning (aligning) of each portion of device element structures formed on the chip region 51 may be used as the position indicator mark.

The silicon carbide semiconductor device 10 according to the embodiment depicted in FIGS. 2 and 3, for example, is an n-channel-type vertical SiC-MOSFET that has, in an active region 41, a trench gate structure (device element structure) in the front side of the semiconductor chip 30, which contains silicon carbide. The active region 41 is a region through which a main current (drift current) flows when the silicon carbide semiconductor device 10 (MOSFET) is ON, and in which plural unit cells (functional units of the device element) of the MOSFET, each having the same structure, are disposed adjacent to one another. In FIG. 3, two adjacent unit cells of the MOSFET are depicted. The active region 41, for example, is disposed in substantially a center (chip center) of each of the semiconductor chips 30.

Each of the semiconductor chips 30 has an edge termination region 42, which is a region between the active region 41 and the end (chip end) of the semiconductor chip 30. The edge termination region 42 has a function of mitigating electric field of the front side of the semiconductor chip 30 and maintaining a breakdown voltage. The breakdown voltage is an upper voltage limit at which no malfunction or destruction of the silicon carbide semiconductor device 10 occurs. In the edge termination region 42, a voltage withstanding structure (not depicted) such as a field limiting ring (FLR) structure, a junction termination extension (JTE) structure, etc. is disposed.

The semiconductor chip 30 is formed using an epitaxial substrate in which the SiC epitaxial layers 32 to 34 constituting, respectively, an n-type buffer region 2, an n$^-$-type drift region (first semiconductor region) 3, and a p-type base region (second semiconductor region) 4 are sequentially formed by epitaxial growth on a front surface of an n$^+$-type SiC substrate (starting substrate) 31 that contains SiC as a semiconductor material. The semiconductor chip 30 has, as a front surface, a main surface having a p-type SiC epitaxial layer (second-conductivity-type epitaxial layer) 34 and as a back surface, a main surface (back surface of the n$^+$-type SiC substrate 31) having the n$^+$-type SiC substrate 31. The n$^+$-type SiC substrate 31 constitutes an n$^+$-type drain region (third semiconductor region) 1. The n$^+$-type SiC substrate 31 is the starting substrate (rough substrate) for the epitaxial wafer.

The n$^+$-type SiC substrate 31 is an individual cut portion of the n$^+$-type SiC wafer (starting wafer for an epitaxial wafer) that is cut from the SiC single crystal ingot, the n$^+$-type SiC substrate 31 has an impurity composition that is the same as that of the SiC single crystal ingot. The n$^+$-type SiC substrate 31 contains boron and aluminum, which are p-type dopants (acceptors) and titanium, which is a transition metal. The boron, aluminum, and titanium in the n$^+$-type SiC substrate 31 function as lifetime killers of majority carriers (electrons) and are adjusted so that the lifetime of the majority carriers of the n$^+$-type SiC substrate 31 becomes shorter. The impurity composition of the n$^+$-type SiC substrate 31 is described hereinafter.

The lifetime of the majority carriers (electrons) of the SiC epitaxial layers (first-conductivity-type epitaxial layer) 32, 33, for example, is at least about 0.5 microseconds (µs) and is longer than the lifetime of the majority carriers of the n$^-$-type SiC substrate 31. The impurity composition of the SiC epitaxial layer 32, 33 is described hereinafter. The n-type buffer region 2 has a function of recombining holes with electrons in the n-type buffer region 2, that is, the holes that occur at the interface of pn junctions 35 when the body diodes formed by the pn junctions (main junctions) 35 of the MOSFET conduct, and thereby causes the holes to disappear and thus, prevents the holes from reaching the n$^+$-type SiC substrate 31. The n-type buffer region 2 may be omitted.

The n$^-$-type drift region 3 is provided between and in contact with the p-type base region 4 and the n-type buffer region 2 (in an instance in which the n-type buffer region 2 is omitted, the n$^+$-type drain region 1). Between the p-type base region 4 and the n$^-$-type drift region 3, n-type current spreading regions 23 and p$^+$-type regions 21, 22 may be provided. The n-type current spreading regions 23 and the p$^+$-type regions 21, 22 are diffused regions formed in the n$^-$-type SiC epitaxial layer 33 by ion implantation. In this instance, a portion 33a of the n$^-$-type SiC epitaxial layer 33 excluding the n-type current spreading regions 23 and the p$^+$-type regions 21, 22 constitutes the n$^-$-type drift region 3.

The n-type current spreading regions 23 and the p$^+$-type regions 21, 22 are provided at deep positions closer to the n$^+$-type drain region 1 than are bottoms of trenches 7. The n-type current spreading regions 23 constitute a so-called current spreading layer (CSL) that reduces carrier spreading resistance. The p$^+$-type regions 21, 22 have a function of mitigating electric field applied to a gate insulating film 8 at the bottoms of the trenches 7. The p$^+$-type regions 21 are provided apart from the p-type base region 4 and face the bottoms of the trenches 7 in a depth direction, respectively. Each of the p$^+$-type regions 22 is provided between a respective adjacent two of the trenches 7 so as to be apart from the p$^+$-type regions 21 and the trenches 7 and in contact with the p-type base region 4.

The trench gate structure is configured by the p-type base region 4, n$^+$-type source regions 5, p$^{++}$-type contact regions 6, the trenches 7, the gate insulating film 8, and gate electrodes 9. The p-type base region 4 is provided between the front surface of the semiconductor chip 30 and the n$^-$-type drift region 3. The n$^+$-type source regions 5 and the p$^{++}$-type contact regions 6 are diffused regions formed in the p-type SiC epitaxial layer 34 by ion implantation. A portion of the p-type SiC epitaxial layer 34 excluding the n$^+$-type source regions 5 and the p$^{++}$-type contact regions 6 constitutes the p-type base region 4.

The n$^+$-type source regions 5 and the p$^{++}$-type contact regions 6 are selectively provided between the front surface of the semiconductor chip 30 and the p-type base region 4, so as to be in contact with the p-type base region 4. The n$^+$-type source regions 5 and the p$^{++}$-type contact regions 6 are in ohmic contact with ohmic electrodes (first electrodes) 12, in contact holes formed in a later-described interlayer insulating film 11. The p$^{++}$-type contact regions 6 may be omitted. In an instance in which the p$^{++}$-type contact regions 6 are omitted, instead of the p$^{++}$-type contact regions 6, the p-type base region 4 is in ohmic contact with the ohmic electrodes 12.

The body diodes of the MOSFET are formed at the pn junctions 35 between the p$^{++}$-type contact regions 6, the p-type base region 4, the p$^+$-type regions 21, 22, the n-type current spreading regions 23, the n$^-$-type drift region 3, the n-type buffer region 2, and the n$^+$-type drain region 1. When the MOSFET is in the OFF state, voltage that is negative with respect to a front electrode 13 is applied to a back electrode 14, whereby forward current flows through the body diodes. For example, in an inverter or the like, the body diodes may be used as freewheeling diodes (FWDs) for rectification by passing current through the MOSFET in a direction opposite to that of the applied voltage.

The trenches 7 penetrate through the n$^+$-type source regions 5 and the p-type base region 4 and reach the n-type current spreading regions 23 (in an instance in which the n-type current spreading regions 23 are omitted, the n$^-$-type drift region 3). In the trenches 7, the gate electrodes 9 are provided via the gate insulating film 8. The interlayer insulating film 11 is provided on the front surface of the semiconductor chip 30 and covers the gate electrodes 9. The ohmic electrodes 12 are a silicide film provided on the front surface of the semiconductor chip 30, via the contact holes of the interlayer insulating film 11. The ohmic electrodes 12 are electrically connected to the p-type base region 4, the n$^+$-type source regions 5, and the p$^{++}$-type contact regions 6.

The front electrode (first electrode) is provided in an entire area of the front surface of the semiconductor chip 30, in the active region 41, so as to be embedded in the contact holes of the interlayer insulating film 11. The front electrode 13 is electrically connected to the p-type base region 4, the n$^+$-type source regions 5, and the p$^{++}$-type contact regions 6 via the ohmic electrodes 12. The ohmic electrodes 12 and the front electrode 13 function as a source electrode. The back electrode (second electrode) 14 is provided on an entire area of the back surface (back surface of the n$^+$-type SiC substrate 31) of the semiconductor chips 30 and is electrically connected to the n$^+$-type drain region 1. The back electrode 14 functions as a drain electrode.

The impurity compositions of the n$^+$-type SiC substrate 31 and the SiC epitaxial layers 32 and 33 are described with reference to FIGS. 4 to 7. FIGS. 4 to 7 depict, respectively, the nitrogen concentration, the boron concentration, the aluminum concentration, and the titanium concentration of the n$^+$-type SiC substrate 31 and the SiC epitaxial layers 32 and 33 of the silicon carbide semiconductor device 10 according to the embodiment (hereinafter, "example", refer to FIGS. 2 and 3) described above. The impurity concentration distribution of the n$^-$-type SiC epitaxial layer 33 depicted in FIGS. 4 to 7 is the impurity concentration distribution of the portion 33a of the n⁻-type SiC epitaxial layer 33 excluding the n-type current spreading regions 23 and the p⁺-type regions 21, 22.

In the example, the n⁺-type SiC substrate 31 contains nitrogen, which is an n-type dopant (donor), within a predetermined concentration range (predetermined impurity concentration of the n⁺-type drain region 1) and other than nitrogen contains all the following impurities: boron, aluminum, and titanium. The nitrogen, boron, aluminum, and titanium in the n⁺-type SiC substrate 31 are introduced during the SiC single crystal growth of the SiC single crystal ingot, which is a material of the n⁺-type SiC substrate 31. The nitrogen concentration, the boron concentration, the aluminum concentration, and the titanium concentration of the n⁺-type SiC substrate 31 are uniform throughout all regions of the n⁺-type SiC substrate 31.

The nitrogen concentration of the n⁺-type SiC substrate 31, for example, is in a range of about $1 \times 10^{18}/cm^3$ to $2 \times 10^{19}/cm^3$. The boron concentration of the n⁻-type SiC substrate 31, for example, is in a range of about $5 \times 10^{16}/cm^3$ to $1 \times 10^{17}/cm^3$. The aluminum concentration of the n⁺-type SiC substrate 31, for example, is in a range of about $1 \times 10^{16}/cm^3$ to $5 \times 10^{16}/cm^3$. The aluminum concentration of the n⁺-type SiC substrate 31 is higher than the titanium concentration of the n⁺-type SiC substrate 31 and about 2 times to 10 times the titanium concentration (in FIGS. 6 and 7, "2 times"). The titanium concentration of the n⁺-type SiC substrate 31, for example, is in a range of about $1 \times 10^{16}/cm^3$ to $5 \times 10^{16}/cm^3$.

The boron, aluminum, and titanium in the n⁺-type SiC substrate 31 are introduced into the n⁺-type SiC substrate 31 in a range such that a sum of respective concentrations thereof is an amount that does not affect the n-type impurity concentration of the n⁺-type SiC substrate 31 (impurity concentration of the n⁺-type drain region 1). In particular, the sum of the respective concentrations of the boron, aluminum, and titanium in the n⁺-type SiC substrate 31 is in a range of about, for example, 1% to 20% of the nitrogen concentration of the n⁺-type SiC substrate 31 and at most is about $2 \times 10^{17}/cm^3$. The boron, aluminum, and titanium in the n⁺-type SiC substrate 31 function as a lifetime killer of majority carriers and has an effect of shortening the lifetime of the majority carriers of the n⁺-type SiC substrate 31 and reducing the reverse recovery current (refer to later-described examples in FIG. 8).

Further, the boron, aluminum, and titanium are introduced into only the n⁻-type SiC substrate 31, whereby the lifetime of the majority carriers of the SiC epitaxial layers 32 and 33 may be set to be longer than the lifetime of the majority carriers of the n⁺-type SiC substrate 31 and the body diode may be operated by a low resistance using the effect of the conductivity modulation. Further, concentration conditions for the boron, aluminum, and titanium in the n⁺-type SiC substrate 31 are controlled to the various conditions described above, whereby an occurrence of a high density of crystal defects in the semiconductor chips 30, caused by crystal dislocations and distortion of crystal lattices that occur in the n⁻-type SiC substrate 31 due to the introduction of the impurities may be suppressed.

Figure 4:
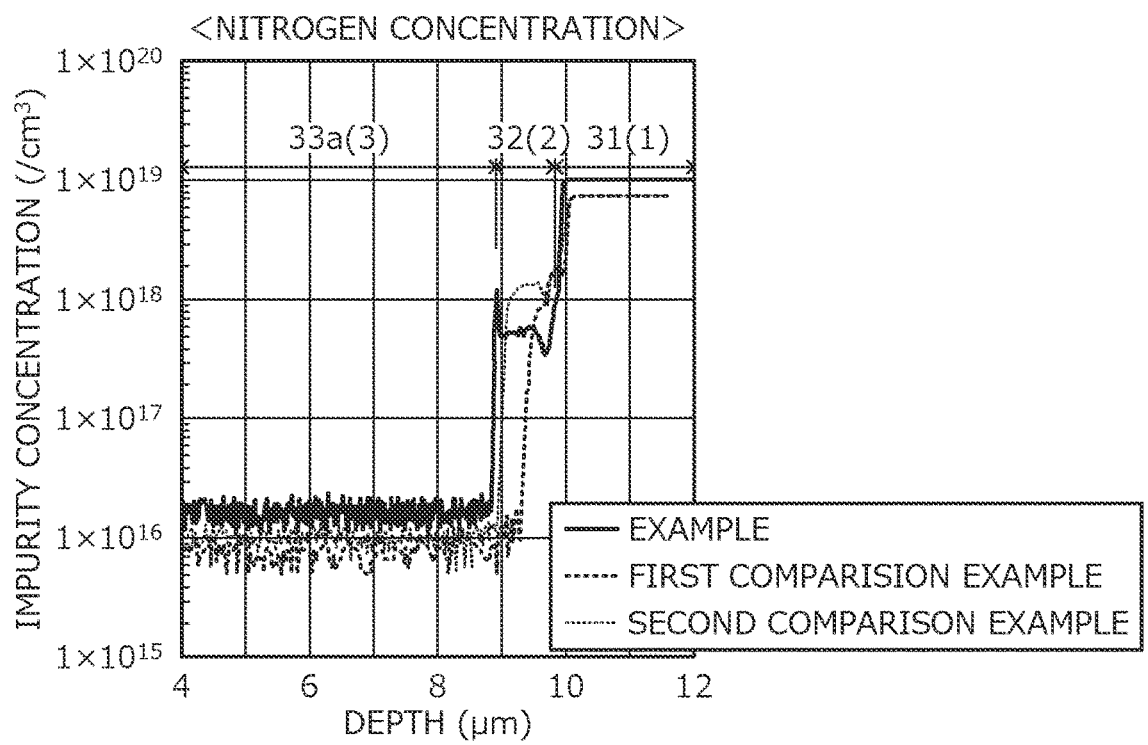
FIG. 4 is a characteristics diagram depicting a nitrogen (N) concentration distribution of a SiC substrate in FIG. 3.
Figure 5:
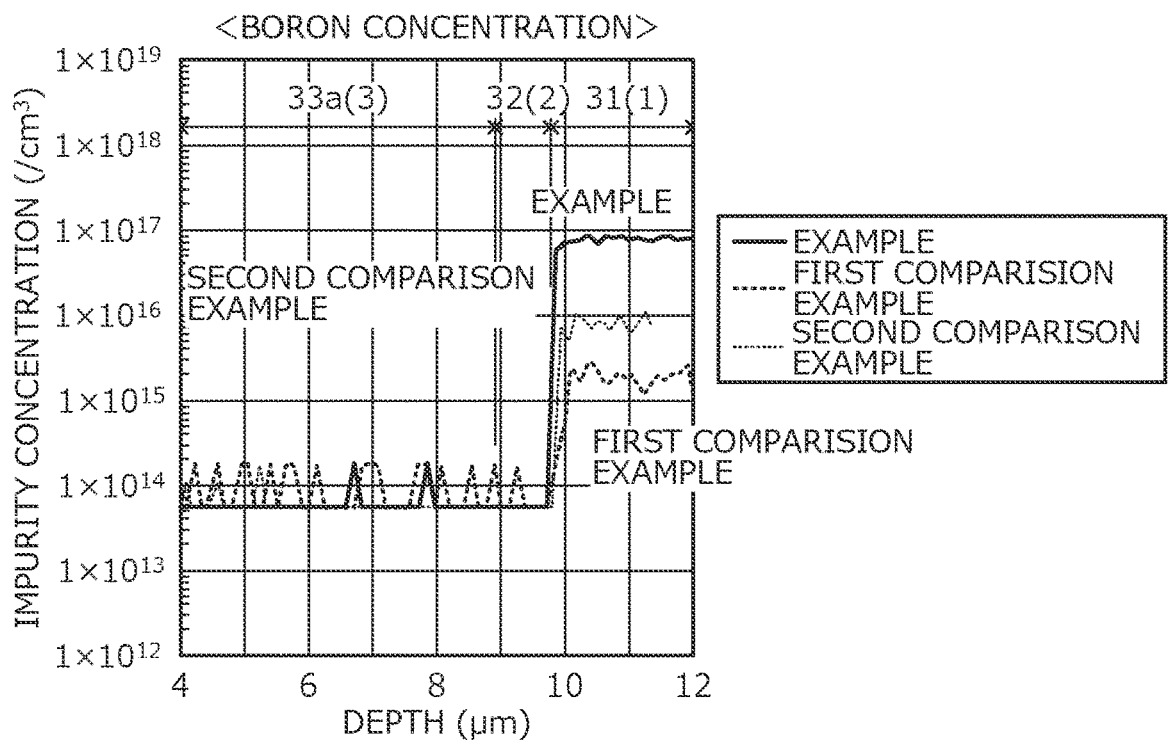
FIG. 5 is a characteristics diagram depicting a boron (B) concentration distribution of the SiC substrate in FIG. 3.
Figure 6:
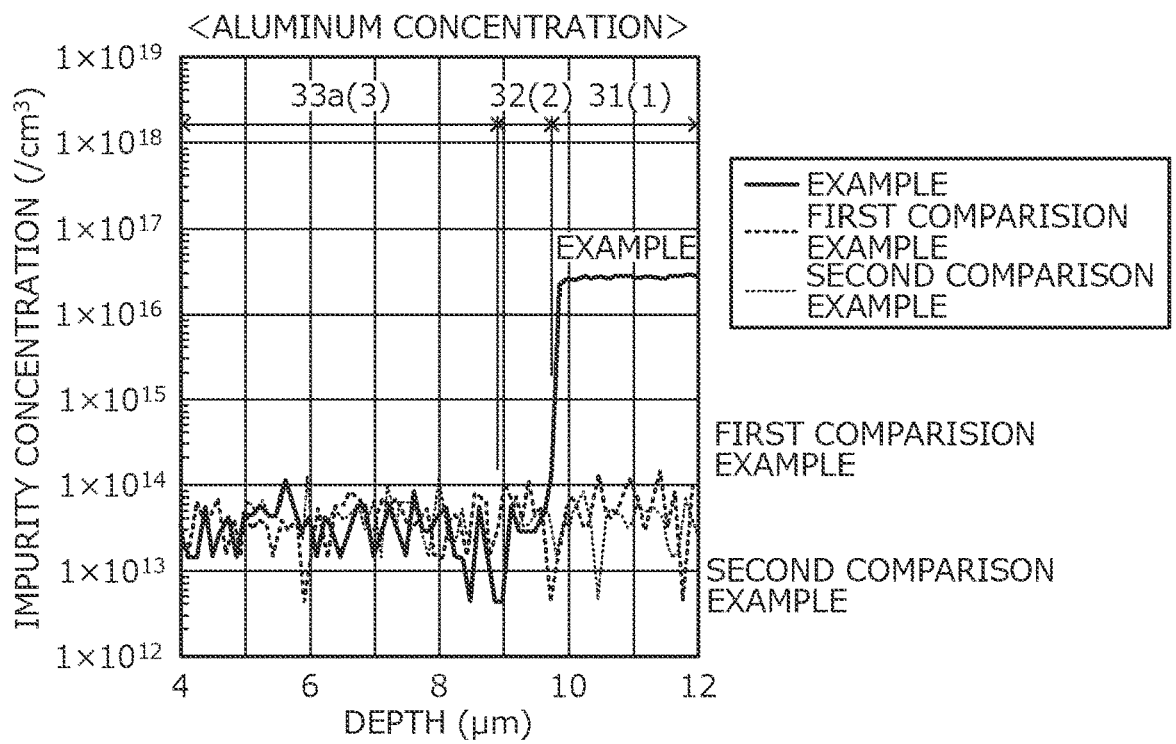
FIG. 6 is a characteristics diagram depicting an aluminum (Al) concentration distribution of the SiC substrate in FIG. 3.
Figure 7:
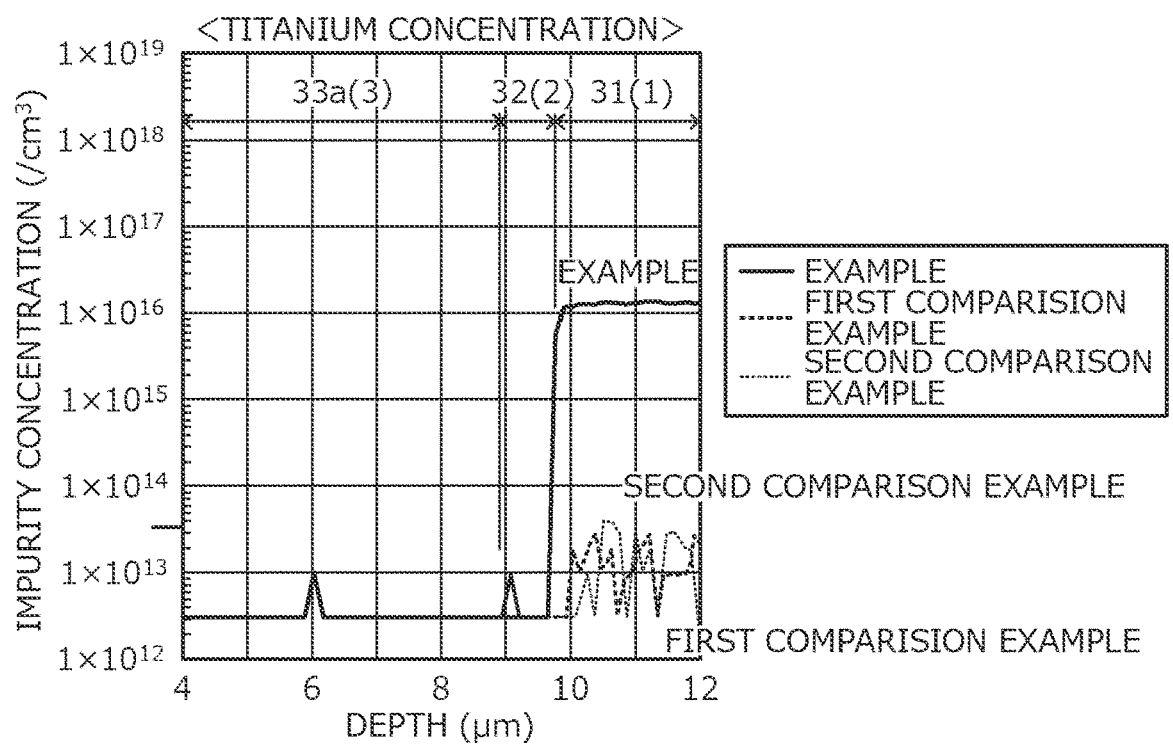
FIG. 7 is a characteristics diagram depicting a titanium (Ti) concentration distribution of the SiC substrate in FIG. 3.

The n-type SiC epitaxial layer 32 contains nitrogen (n-type dopant) within a predetermined concentration range (predetermined impurity concentration of the n-type buffer region 2). The n⁻-type SiC epitaxial layer 33 contains nitrogen (n-type dopant) within a predetermined concentration range (predetermined impurity concentration of the n⁻-type drift region 3). A nitrogen concentration of the n⁻-type SiC epitaxial layer 33 depicted in FIG. 4 is below a detectable limit (in an undetectable impurity concentration range), and the nitrogen concentration distribution includes noise. The nitrogen concentration of the n⁻-type SiC epitaxial layer 33 is calculated by averaging the noise waveforms included in the nitrogen concentration distribution of the n⁻-type SiC epitaxial layer 33.

The SiC epitaxial layers 32 and 33, excluding an instance of unavoidable contamination, contain no impurities other than nitrogen. Excluding the concentration of nitrogen, the impurity concentrations of the SiC epitaxial layers 32 and 33 are less than about $1 \times 10^{14}/cm^3$ for each of the impurities, other than nitrogen, that unavoidably contaminate the SiC epitaxial layers 32 and 33. In the boron concentration distribution, the aluminum concentration distribution, and the titanium concentration distribution of the n⁻-type SiC epitaxial layer 33 depicted in FIGS. 5 to 7, respectively, noise is generated by the boron, aluminum, and titanium that unavoidably contaminate the n⁻-type SiC epitaxial layer 33, and the respective impurity concentrations are calculated by averaging. A border portion between the n⁺-type SiC substrate 31 and the SiC epitaxial layer 32 in FIGS. 4 to 7 is set to be an intermediate portion of an inclined portion. This is because since mass spectrometry is performed by ejecting elements of a surface of a certain area, it may be considered that elements of both the SiC epitaxial layer 32 and the n⁺-type SiC substrate 31 are detected at the border portion. Accordingly, the intermediate portion of the inclined portion has an area that is equal to the area of the SiC epitaxial layer 32 and the n⁺-type SiC substrate 31 and corresponds to the border portion.

Operation of the silicon carbide semiconductor device 10 according to the embodiment is described. When voltage at least equal to a gate threshold voltage is applied to the gate electrodes 9 while voltage (forward voltage) that is positive with respect to the source electrode (the front electrode 13) is applied to the drain electrode (the back electrode 14), a channel (n-type inversion layer) is formed at channel portions of the p-type base region 4, along sidewalls of the trenches 7. As a result, the main current (drift current) passes through the channel portions from the n⁺-type drain region 1 and flows to the n⁺-type source regions 5, whereby the SiC-MOSFET (the silicon carbide semiconductor device 10) turns ON.

On the other hand, when voltage that is lower than the gate threshold voltage is applied to the gate electrodes 9 while voltage that is positive with respect to the source electrode is applied to the drain electrode, the pn junctions 35 between the p⁺-type regions 21, 22, the p-type base region 4, the n-type current spreading regions 23, the n⁻-type drift region 3, and the n-type buffer region 2 are reverse biased, whereby the SiC-MOSFET maintains the OFF state. Further, during reverse bias of the pn junctions 35, a depletion layer spreads from the pn junctions 35 to the p⁺-type regions 21, 22 and/or the n-type current spreading regions 23, whereby electric field applied to the gate insulating film 8 at the bottoms of the trenches 7 is mitigated.

Further, during the OFF state of the SiC-MOSFET, voltage that is negative with respect to the source electrode is applied to the drain electrode, whereby current may be caused to flow in a forward direction in the parasitic diodes (body diodes) formed by the pn junctions 35. Further, the boron, the aluminum, and the titanium that function as a lifetime killer of the majority carriers is introduced into only the n⁺-type SiC substrate 31, whereby the lifetime of the majority carriers in the n⁻-type drift region 3 becomes longer than the lifetime of the majority carriers in the n⁺-type SiC substrate 31 and thus, the body diodes may be caused to operate by a low resistance by using the effect of conductivity modulation.

Next, a method of manufacturing the silicon carbide semiconductor device 10 according to the embodiment is described. First, the n$^+$-type SiC wafer (starting wafer) that constitutes the n$^+$-type SiC substrate 31 that contains silicon carbide as a semiconductor material is prepared. The n$^+$-type SiC wafer that constitutes the n$^+$-type SiC substrate 31 contains nitrogen (n-type dopant) within a predetermined concentration range (predetermined impurity concentration of the n$^+$-type drain region 1) and contains, under the conditions described above, all the following impurities: boron, aluminum, and titanium, which function as a lifetime killer of majority carriers.

Next, on the front surface of the n$^+$-type SiC wafer, the n-type SiC epitaxial layer 32 that constitutes the n-type buffer region 2 is epitaxially grown (deposited). Next, on the n-type SiC epitaxial layer 32, the n$^-$-type SiC epitaxial layer 33 that constitutes the n$^-$-type drift region 3 is epitaxially grown (deposited). Here, the n$^-$-type SiC epitaxial layer 33 is epitaxially grown to have a thickness that is thinner than a predetermined thickness after completion of a product (the silicon carbide semiconductor device 10). The SiC epitaxial layers 32 and 33 contain, under the conditions described above, only nitrogen, which is an n-type dopant.

Next, by photolithography and ion implantation of a p-type impurity, the p$^+$-type regions 21 and lower portions (portions facing the n$^+$-type drain region 1) of the p$^+$-type regions 22 are each selectively formed in surface regions of the n$^-$-type SiC epitaxial layer 33 so as to be disposed apart from one another and repeatedly alternate one another. Further, by photolithography and ion implantation of an n-type impurity, lower portions of the n-type current spreading regions 23 are formed in surface regions of the n$^-$-type SiC epitaxial layer 33, between the p$^+$-type regions 21 and the p$^+$-type regions 22 that are adjacent to one another.

Next, epitaxial growth is further performed, thereby increasing the thickness of the n$^-$-type SiC epitaxial layer 33 to a predetermined thickness. Next, by photolithography and ion implantation of a p-type impurity, upper portions (portions facing the n$^+$-type source regions 5) of the p$^+$-type regions 22 are selectively formed in the portion by which the thickness of the n$^-$-type SiC epitaxial layer 33 is increased. Further, in the portion by which the thickness of the n$^-$-type SiC epitaxial layer 33 is increased, upper portions of the n-type current spreading regions 23 are each formed between a respective adjacent two of the p$^+$-type regions 22, by photolithography and ion implantation of an n-type impurity.

The upper portions of the p$^+$-type regions 22 and the upper portions of the n-type current spreading regions 23, at positions facing the lower portions of the p$^+$-type regions 22 and at positions facing the lower portions of the n-type current spreading regions 23 in the depth direction, respectively, are formed at depths penetrating through the portion by which the thickness of the n$^-$-type SiC epitaxial layer 33 is increased, thereby connecting the upper portions of the p$^+$-type regions 22 with the lower portions of the p$^+$-type regions 22 and the upper portions of the n-type current spreading regions 23 with the lower portions of the n-type current spreading regions 23. The portion 33$a$ of the n$^-$-type SiC epitaxial layer 33 is closer to the n$^+$-type SiC substrate 31 than are the p$^+$-type regions 21, 22 and the n-type current spreading regions 23 and constitutes the n$^-$-type drift region 3.

Next, on the n$^-$-type SiC epitaxial layer 33, the p-type SiC epitaxial layer 34 that constitutes the p-type base region 4 is epitaxially grown (deposited). By the processes up to here, the semiconductor wafer 50 in which the SiC epitaxial layers 32 to 34 are sequentially stacked on the n$^+$-type SiC wafer is fabricated (manufactured). The semiconductor wafer 50 itself may be purchased. Next, in surface regions of the p-type SiC epitaxial layer 34, the n$^+$-type source regions 5 and the p$^{++}$-type contact regions 6 are selectively formed.

A portion of the p-type SiC epitaxial layer 34 excluding the n$^+$-type source regions 5 and the p$^{++}$-type contact regions 6 constitutes the p-type base region 4. Next, a heat treatment for activating all the ion-implanted impurities is performed. Next, by a general method, the trenches 7, the gate insulating film 8, the gate electrodes 9, the interlayer insulating film 11, the ohmic electrodes 12, the front electrode 13, and the back electrode 14 are formed. Thereafter, the semiconductor wafer 50 is diced (cut) into the individual semiconductor chips 30, whereby the silicon carbide semiconductor device 10 depicted in FIGS. 2 and 3 is completed.

As described above, according to the embodiment, the n$^+$-type SiC substrate (starting substrate for the epitaxial wafer) that constitutes the n$^+$-type drain region contains nitrogen (donor) of the predetermined impurity concentration range, and other than nitrogen contains all the following impurities: boron, aluminum, and titanium in a range such that the sum of the respective concentrations of the boron, the aluminum, and the titanium does not affect the n-type impurity concentration of the n$^+$-type SiC substrate. In the n$^+$-type SiC substrate, the impurities other than nitrogen function as a lifetime killer of the majority carriers, whereby the lifetime of the majority carriers of the n$^+$-type SiC substrate is shortened and thus, when the body diodes of the SiC-MOSFET conduct, an injection of holes to the n$^-$-type drift region is suppressed.

As a result, the amount of charge accumulated in the n$^-$-type drift region is reduced, whereby the reverse recovery current that flows during the switching operation from OFF to ON of the SiC-MOSFET may be reduced. Thus, according to the embodiment, the reverse recovery characteristics of the SiC-MOSFET may be enhanced by controlling the boron concentration, the aluminum concentration, and the titanium concentration of the n$^+$-type SiC substrate, without additional processes (epitaxial growth for stacking multiple n-type buffer regions of differing impurity concentrations, particle beam irradiation for adjusting the carrier lifetime of the n$^-$-type drift region and the n$^+$-type drain region).

Figure 8:
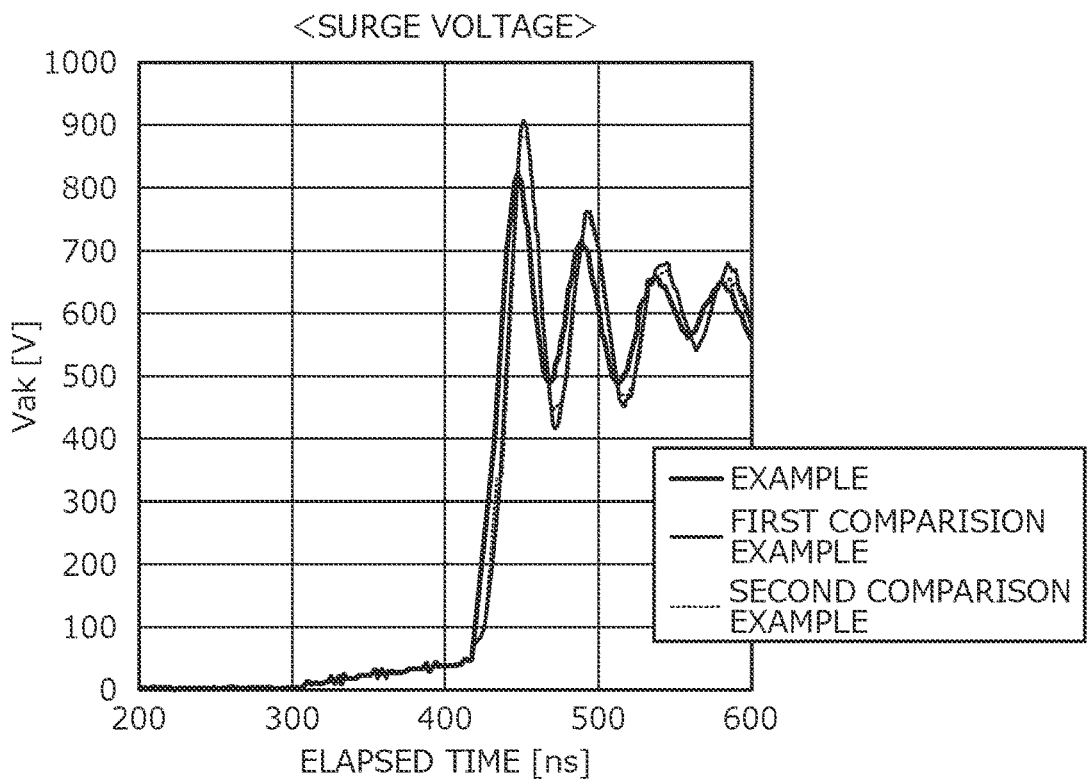
FIG. 8 is a characteristics diagram depicting results of measurement of surge voltage during reverse recovery in the example.
Figure 9:
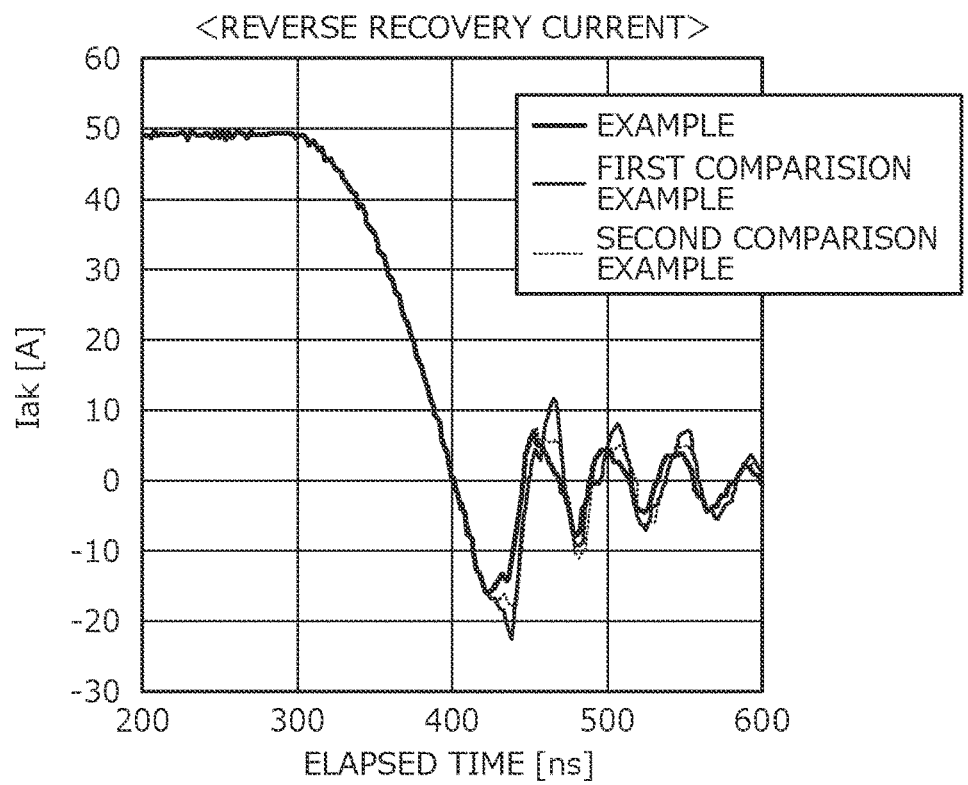
FIG. 9 is a characteristics diagram depicting results of measurement of reverse recovery current in the example.

Next, an experimental example is described. The reverse recovery characteristics of the silicon carbide semiconductor device 10 according to the embodiment described above (refer to FIGS. 2 to 7) were verified. FIGS. 8, 9, and 10 are characteristics diagrams depicting results of measurement of surge voltage during reverse recovery, reverse recovery current, and the amount of charge in the drift region during reverse recovery, in the example. For the example described above and the first and second comparison examples, measurement of the reverse recovery characteristics (surge voltage, reverse recovery current, and amount of charge in the n$^-$-type drift region 3) are depicted in FIGS. 8 to 10, respectively. In FIGS. 8 to 10, a horizontal axis indicates the elapsed time [nanoseconds (ns)]. In FIGS. 8 to 10, vertical axes indicate reverse recovery voltage Vak [V], reverse recovery current Iak [A], and charge (carrier) amount Qrr [μC], respectively.

The first and second comparison examples differ from the example in that the n$^+$-type SiC substrate, which constitutes the n$^+$-type drain region, does not contain aluminum or titanium. In other words, in the first and second comparison examples, the n+-type SiC substrate, which constitutes the n+-type drain region, contains only boron other than nitrogen, which is an n-type dopant. Conditions of the SiC epitaxial layers constituting the n-type buffer region and the n−-type drift region of the first and second comparison examples are, respectively, similar to those of the SiC epitaxial layers 32 and 33 of the example. For the semiconductor chip of the first and second comparison examples, the nitrogen concentration distribution, the boron concentration distribution, the aluminum concentration distribution, and the titanium concentration distribution of the same location as that in the example are depicted in FIGS. 4 to 7, respectively.

Further, in the first and second comparison examples, the n+-type drain region is configured by the n+-type SiC substrate that is doped with boron of different impurity concentrations, respectively. The boron concentration of the n−-type SiC substrate of the second comparison example is about one order of magnitude higher than the boron concentration of the n+-type SiC substrate of the first comparison example. In the boron concentration distribution, the aluminum concentration distribution, and the titanium concentration distribution of the n−-type SiC epitaxial layer that constitutes the n−-type drift region of the first and second comparison examples depicted, respectively, in FIGS. 5 to 7, similarly to the example, noise is generated by the boron, aluminum, and titanium that unavoidably contaminate the n−-type SiC epitaxial layer, and the respective impurity concentrations are calculated by averaging.

In the example, the nitrogen concentration of the n+-type SiC substrate 31 is set to $1 \times 10^{19}/cm^3$, the boron concentration is set to $1 \times 10^{17}/cm^3$, the aluminum concentration and the titanium concentration are lower than the boron concentration, and the aluminum concentration is 2 times the titanium concentration. In the first and second comparison examples, respectively, the boron concentration of the n+-type SiC substrate that constitutes the n+-type drain region is set to one and two orders of magnitude lower than the boron concentration of the n+-type SiC substrate 31 of the example. Further, in the first and second comparison examples, the boron concentration of the n+-type SiC substrate that constitutes the n+-type drain region is set to be higher than the boron concentration of the n+-type drain region recited in Japanese Laid-Open Patent Publication No. 2021-141146. Other than the boron concentration of the n+-type SiC substrate that constitutes the n+-type drain region, configuration of the first and second comparison examples is the same as that of the example.

From the results depicted in FIGS. 8 to 10, it was confirmed that while the boron concentration of the n+-type SiC substrate that constitutes the n+-type drain region differed in the first and second comparison examples, in the first and second comparison examples, the reverse recovery current, the surge voltage, and the amount of charge in the n−-type drift region have the same respective results. Thus, when the boron concentration of the n+-type SiC substrate that constitutes the n+-type drain region is simply increased or the n+-type SiC substrate simply contains boron, it is presumed that this does not contribute to decreasing the reverse recovery current.

On the other hand, from the results depicted in FIGS. 8 to 10, it was confirmed that in the example, as compared to the first and second comparison examples, the surge voltage, the reverse recovery current, and the amount of charge in the n−-type drift region 3 could be reduce. The aluminum and the titanium in the n+-type SiC substrate 31 that constitutes the n+-type drain region 1 of the example are presumed to greatly contribute to reducing the reverse recovery current, the surge voltage, and the amount of charge in the n−-type drift region.

Further, while the impurity concentration of the n−-type drift region is the same in the example and in the first and second comparison examples, the boron concentration of the n+-type SiC substrate that constitutes the n+-type drain region differs from the n+-type drain region by one order of magnitude and differs from the first and second comparison examples by one order of magnitude. As described above, while the amount of charge in the n−-type drift region is reduced most by the example, results for the first and second comparison examples are the same and therefore, the amount of charge in the n−-type drift region is presumed to be independent of the boron concentration of the n+-type SiC substrate that constitutes the n+-type drain region.

In the foregoing, the present invention is not limited to the embodiments described above and may be variously modified within a range not departing from the spirit of the invention.

According to the invention described above, boron, aluminum, and titanium in the starting substrate function as a lifetime killer of the majority carriers, whereby the lifetime of the majority carriers of the starting substrate is reduced and the amount of charge accumulated in the n−-type drift region decreases, thereby enabling reduction of the reverse recovery current.

The silicon carbide semiconductor device and silicon carbide semiconductor substrate according to the present invention achieve an effect in that the reverse recovery characteristics may be enhanced.

As described, the silicon carbide semiconductor device and the silicon carbide semiconductor substrate according to the present invention is useful for power semiconductor devices used in power converting equipment, power source devices used in various types of industrial machines, etc. and is particularly suitable for n-channel-type vertical SiC-MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate containing silicon carbide, the silicon carbide semiconductor substrate having a first main surface and a second main surface that are opposite to each other;
   a first semiconductor region of a first conductivity type, provided in the silicon carbide semiconductor substrate;
   a second semiconductor region of a second conductivity type, provided between the first main surface of the silicon carbide semiconductor substrate and the first semiconductor region;
   a third semiconductor region of the first conductivity type, provided between the second main surface of the silicon carbide semiconductor substrate and the first semiconductor region, the third semiconductor region having an impurity concentration that is higher than an impurity concentration of the first semiconductor region;
   a device element structure provided in the silicon carbide semiconductor substrate, at the first main surface, the device element structure having, as a main junction, a pn junction between the second semiconductor region and the first semiconductor region;

a first electrode provided on the first main surface, the first electrode being electrically connected to the pn junction; and a second electrode provided on the second main surface, wherein the third semiconductor region:
   contains a predetermined concentration of nitrogen, the nitrogen being a donor,
   contains boron in a range of $5\times10^{16}/cm^3$ to $1\times10^{17}/cm^3$, and
   contains aluminum and titanium, each in a range of $1\times10^{16}/cm^3$ to $5\times10^{16}/cm^3$.

2. The silicon carbide semiconductor device according to claim 1, wherein the silicon carbide semiconductor substrate includes:

a starting substrate of the first conductivity type, and containing silicon carbide, the starting substrate constituting the third semiconductor region, the starting substrate having a first surface and a second surface opposite to each other, the second surface of the starting substrate forming the second main surface of the silicon carbide semiconductor substrate, a first-conductivity-type epitaxial layer containing silicon carbide, the first-conductivity-type epitaxial layer constituting the first semiconductor region, the first-conductivity-type epitaxial layer having a first surface and a second surface opposite to each other, the second surface of the first-conductivity-type epitaxial layer being provided on the first surface of the starting substrate, and a second-conductivity-type epitaxial layer containing silicon carbide, and having a first surface and a second surface opposite to each other, the second-conductivity-type epitaxial layer constituting the second semiconductor region, the second-conductivity-type epitaxial layer being provided on the first surface of the first-conductivity-type epitaxial layer, the first surface of the second-conductivity-type epitaxial layer forming the first main surface of the silicon carbide semiconductor substrate.

3. The silicon carbide semiconductor device according to claim 2, wherein
the first-conductivity-type epitaxial layer contains the predetermined concentration of the nitrogen, the nitrogen being a donor, and
a concentration of an impurity other than the nitrogen in the first-conductivity-type epitaxial layer is less than $1\times10^{14}/cm^3$.

4. The silicon carbide semiconductor device according to claim 2, wherein
a concentration of the nitrogen in the starting substrate is in a range of $1\times10^{18}/cm^3$ to $2\times10^{19}/cm^3$,
a sum of respective concentrations of the boron, the aluminum, and the titanium in the starting substrate is in a range of 1% to 20% of the concentration of the nitrogen in the starting substrate.

5. The silicon carbide semiconductor device according to claim 4, wherein
the sum of the respective concentrations of the boron, the aluminum, and the titanium in the starting substrate is at most $2\times10^{17}/cm^3$.

6. The silicon carbide semiconductor device according to claim 2, wherein
the concentration of the aluminum in the starting substrate is higher than the concentration of the titanium in the starting substrate.

7. The silicon carbide semiconductor device according to claim 6, wherein
the concentration of the aluminum in the starting substrate is in a range of 2 times to 10 times the concentration of the titanium in the starting substrate.

8. The silicon carbide semiconductor device according to claim 2, wherein
a majority carrier lifetime of the first-conductivity-type epitaxial layer is longer than a majority carrier lifetime of the starting substrate.

9. A silicon carbide semiconductor substrate used in a vertical silicon carbide semiconductor device having a device element structure that has a main junction, the silicon carbide semiconductor substrate comprising:

a starting substrate of the first conductivity type, the starting substrate containing silicon carbide and having a first surface and a second surface opposite to each other;

a first-conductivity-type epitaxial layer containing silicon carbide, the first-conductivity-type epitaxial layer being provided on the first surface of the starting substrate and having an impurity concentration that is lower than an impurity concentration of the starting substrate, the first-conductivity-type epitaxial layer having a first surface and a second surface that are opposite to each other, the second surface of the first-conductivity-type epitaxial layer facing the starting substrate; and a second-conductivity-type epitaxial layer containing silicon carbide, being provided on the first surface of the first-conductivity-type epitaxial layer and forming a pn junction with the first-conductivity-type epitaxial layer, the pn junction constituting the main junction, wherein a first main surface is formed by the second-conductivity-type epitaxial layer a second main surface is formed by the starting substrate, and the starting substrate:
   contains a predetermined concentration of nitrogen, the nitrogen being a donor,
   contains boron in a range of $5\times10^{16}/cm^3$ to $1\times10^{17}/cm^3$, and
   contains aluminum and titanium, each in a range of $1\times10^{16}/cm^3$ to $5\times10^{16}/cm^3$.

\* \* \* \* \*